United States Patent [19]
Kato

[11] Patent Number: 6,130,547
[45] Date of Patent: Oct. 10, 2000

[54] TEST APPARATUS FOR PRINTED CIRCUIT BOARD AND ASSEMBLY KIT THEREFOR

[76] Inventor: Masatoshi Kato, 885-3 Yamamiyacho, Kofu-shi, Yamanashi-ken, Japan

[21] Appl. No.: 09/201,681

[22] Filed: Nov. 30, 1998

[51] Int. Cl.[7] .................................................. G01R 31/02
[52] U.S. Cl. .......................... 324/761; 324/754; 324/755; 324/758
[58] Field of Search .................................... 324/761, 754, 324/755, 758

[56] References Cited

U.S. PATENT DOCUMENTS

| | | | |
|---|---|---|---|
| 5,493,230 | 2/1996 | Swart et al. | 324/754 |
| 5,663,655 | 9/1997 | Johnston et al. | 324/761 |
| 5,818,248 | 6/1998 | St. Onge | 324/761 |
| 5,945,836 | 8/1999 | Sayre et al. | 324/761 |

*Primary Examiner*—Safet Metjahic
*Assistant Examiner*—James C Kerveros

[57] ABSTRACT

An apparatus for testing integrity of a printed circuit board is provided which employs a probe with moveable and/or fixed needle portions at its ends and a flange, probe retention boards having apertures for sliding the probe through, an interface board disposed parallel to the probe retention boards. The flange is disposed between the retention boards and the interface board. The needle portion provided away from the interface board comes in contact with the printed circuit board for testing. No socket is used in the apertures for accommodating the probe in the apertures. An assembly kit including these parts are provided for assembly by a user.

17 Claims, 4 Drawing Sheets

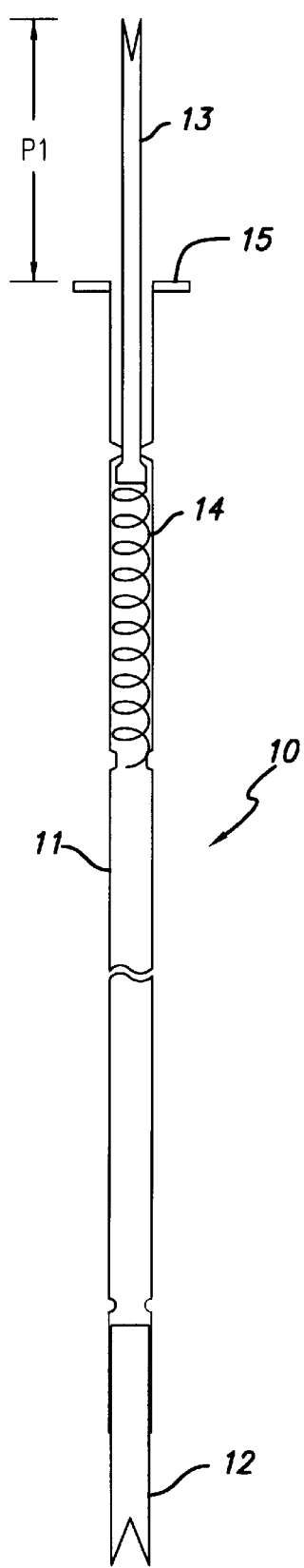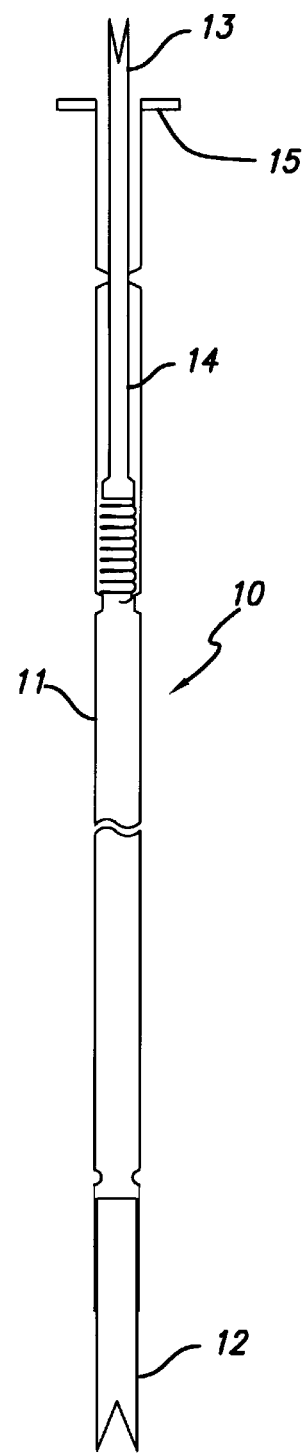

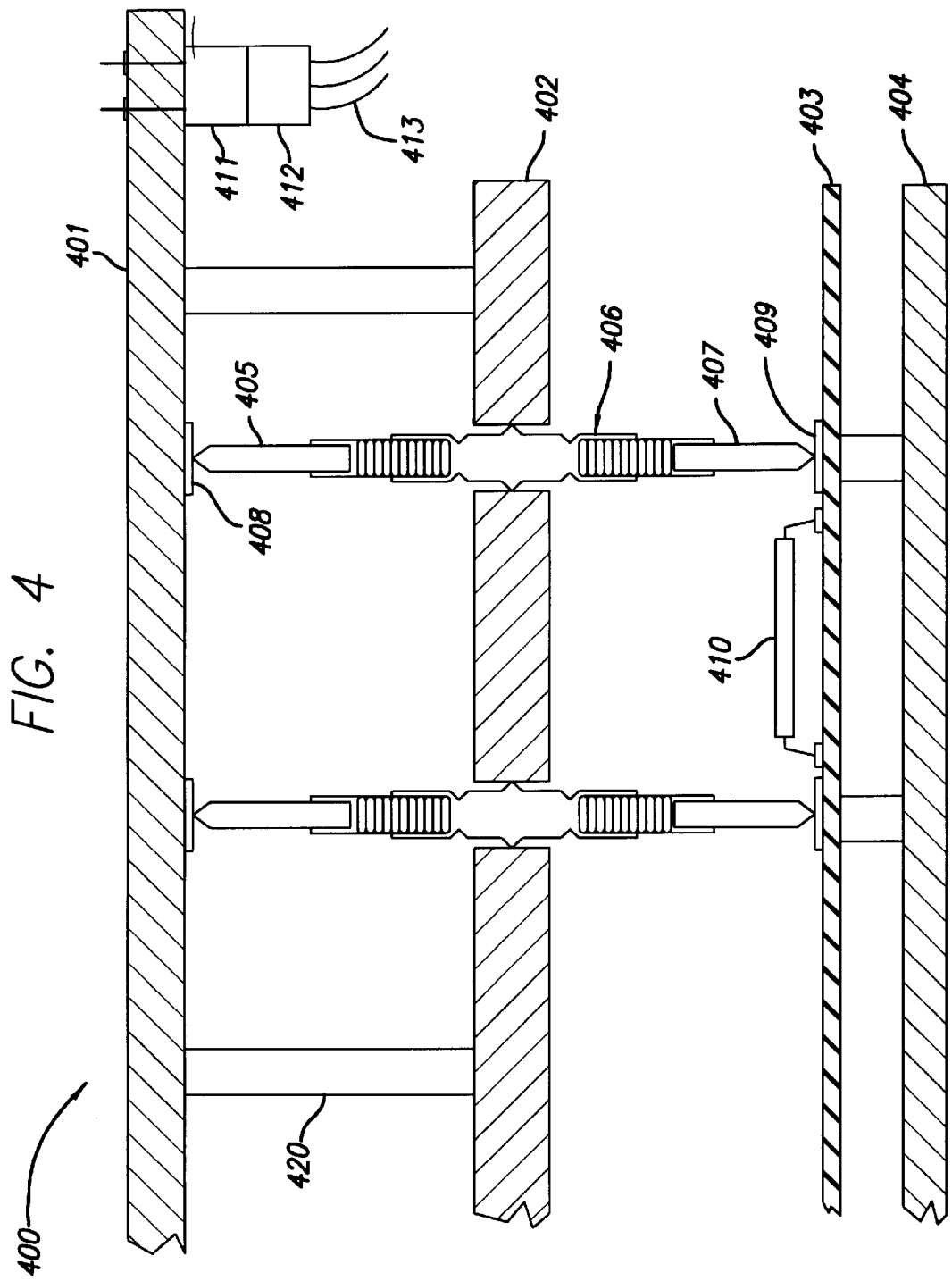

TEST APPARATUS FOR PRINTED CIRCUIT BOARD AND ASSEMBLY KIT THEREFOR

BACKGROUND OF THE INVENTION

1. Field of the Invention

The present invention relates to a test apparatus for printed circuit board and an assembly kit therefor. More particularly, it relates to a type of test apparatus which utilizes probes to detect that electrical contacts are established.

2. Background

It is known to use a test apparatus shown in FIG. 4 for testing for a disconnection in a printed circuit pattern of a printed circuit board, a short in the printed circuit patterns, and for defects, etc. of electronic parts mounted on a printed circuit board. FIG. 4 shows a test apparatus which is testing a printed circuit board.

Referring to FIG. 4, a conventional apparatus is described herein. A test unit 400 including an interface plate 401 and a socket retention plate 402 is vertically moved by driving means (not shown). While the test unit is in a raised state, a printed circuit board 403 to be tested is mounted on a printed circuit board setting plate 404, and thereafter the test unit 400 is lowered so that a probe 407 comes in contact with and tests the printed circuit board 403.

A socket 406 is fixed on the socket retention plate 402. The first probe 407 and a second probe 405 are inserted into the socket. The first probe 407 comes in contact with a printed circuit pattern 409 on the printed circuit board 403, and the second probe 405 comes in contact with a pad 408 provided on the interface plate 401. On the outer circumference of the socket 406, an annular protrusion is provided, and by driving the socket 406 into the socket retention plate 402 by using a tool provided for that purpose, the socket 406 is pressfit.

The socket retention plate 402 and the interface plate 401 are connected by a support column 420. The length of the support column 402 is designed so that the second probe 405 comes into contact with the interface board 401 with a predetermined amount of pin pressure.

The interface plate 401 is a printed circuit board, and connects the pad 408, with which the second probe 405 make a contact, and the lead of a connector A 411 by a printed circuit pattern. Accordingly, the printed circuit pattern of the printed circuit board 403 to be tested and the tester are connected via the first probe 407, the socket 406, the second probe 405, the printed circuit pattern of the interface plate 401, the connector A 411, a connector B 412 and a cable 413, and electrical signals are provided from the tester to a certain location on the interface plate 401, thereby testing the printed circuit board 403 by observing electric signals at a predetermined location on the interface board 401.

However, there are problems with the conventional technology as described below. First, two materials are used for the probes 407, 405 and the socket 406. For this reason, the material cost is high and the number of assembly steps are increased. Further, in order to press-fit the probes 407, 405, a predetermined amount of play must exist between the outer diameters of the probes 407, 405 and the interior diameter of the socket 406, and this results in inaccuracies in the locations of the tip ends of the probes 407, 405.

Second, in order to increase the accuracy in the locations of the tip ends of the probes 407, 405, it is necessary to increase the degree of perpendicularity of the socket 406 with respect to the socket retention plate 402. In order to achieve this, it is necessary to thicken the socket retention plate 402, but if it is thickened, the test unit 400 becomes heavy.

Third, there are times when flux which is generated during soldering becomes attached to the printed circuit board 403, and in order to eliminate contact defects between the probes 407, 405 and the printed circuit board 403 to be tested, it is necessary to place a predetermined amount of load on the printed circuit board 403 with the probes 407, 405. At that time, if there are numerous probes 407, 405, this place a significant amount of load on the socket retention plate 402, and it becomes necessary to thicken the socket retention plate 402. However, this causes the test unit 400 to be heavy.

Fourth, a high level of skills are required to accurately drive a great number of sockets into the socket retention plate 402. Accordingly, only after all the sockets 406 and the probes 407, 405 are assembled onto the test unit 400, the test unit 400 is shipped to a user from the test apparatus manufacturer. For this reason, a special packaging is required in order to protect the tip ends of the probes 407, 405, and further because assembled products are shipped, there is a problem of large package size. It is therefore an object of the present invention to provide a probe which can be used without a socket.

It is therefore another object of the present invention to decrease the number of parts which are required.

It is yet another object of the present invention to decrease the material cost.

It is another object of the present invention to provide an assembly kit for a test apparatus which even a user can use to accurately test a printed board.

Additional objects and advantages of the present invention will be apparent from the following detailed description of a preferred embodiment thereof, which proceeds with reference to the accompanying drawings.

SUMMARY OF THE INVENTION

A test apparatus for printed circuit board according to the present invention includes a probe having a moveable needle portion and a fixed needle portion and a flange provided on the outer diameter thereof, probe retention boards with probe retention apertures through which the probe slides, and an interface board provided parallel to the probe retention boards. The test apparatus moves toward a printed circuit board to be tested to establish contact between the printed circuit board and the fixed needle portion of the probe. The probe does not require a socket to be driven into the apertures because the flange disposed between the interface board and the probe retention boards is designed to define the travel of the probe.

By providing multiple probe retention boards, the perpendicularity of the probe with respect to the printed circuit board to be tested is enhanced. Further, support such as coil springs is provided between the printed circuit board to be tested and the probe retention boards so that the tip of the probe will be protected when it is not in use.

BRIEF DESCRIPTION OF THE DRAWINGS

FIGS. 1 (*a*) and (*b*) are cross-sectional views of probes used in a test unit provided according to the present invention;

FIG. 4 is a cross-sectional view for a prior art test unit for printed circuit board.

DETAILED DESCRIPTION OF THE INVENTION

Figure 2:
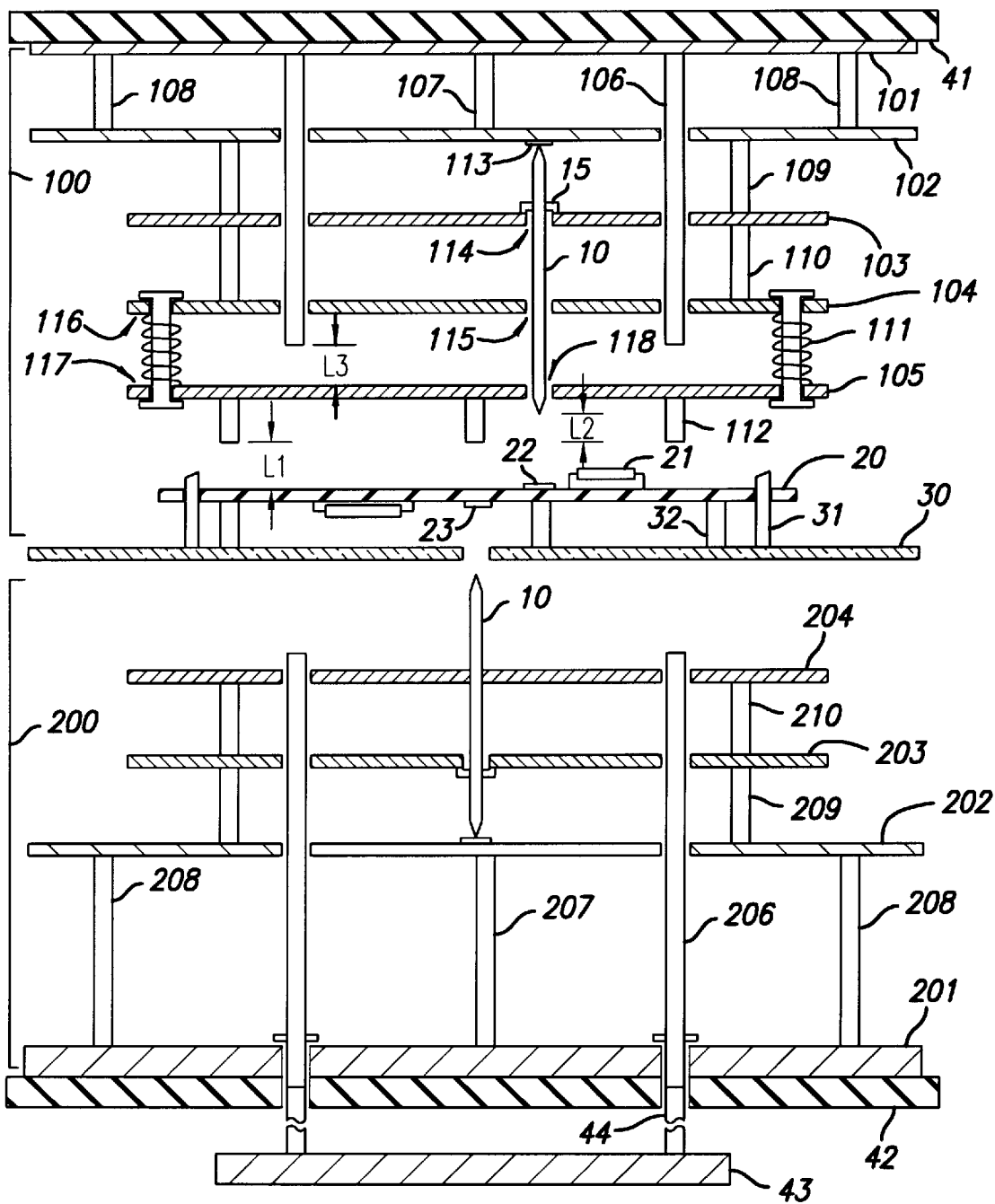
FIG. 2 is a cross-sectional view of the test unit according to the present invention before testing a printed circuit board.

Details of probes used in the present invention are shown in FIG. 1. FIG. 1 (a) shows a probe 10 when there is no load placed thereon. The probe 10 is provided with an outer tube 11, a fixed needle 12 which is fixed to the lower portion of the outer tube 11, and a moveable needle 13 disposed in the upper portion of the outer tube 11 which can freely slide upward as well as downward with respect to the outer tube 11 Inside the outer tube 11, an elastic or resilient part such as a spring coil 14 and the like is contained. When force is applied on the moveable needle 13 from above, the moveable needle 13 contracts or moves down along the interior wall of the outer tube 11. A flange 15 is provided on the upper edge of the outer tube 11. The end tips of the moveable needle 13 and the fixed needle 12 have multiple points in order to definitely make contacts with a printed circuit pattern of a printed circuit board. FIG. 1 (b) shows a state where force is exerted onto the probe 10 and the moveable needle 13 is sunk into the outer tube 11.

Figure 3:
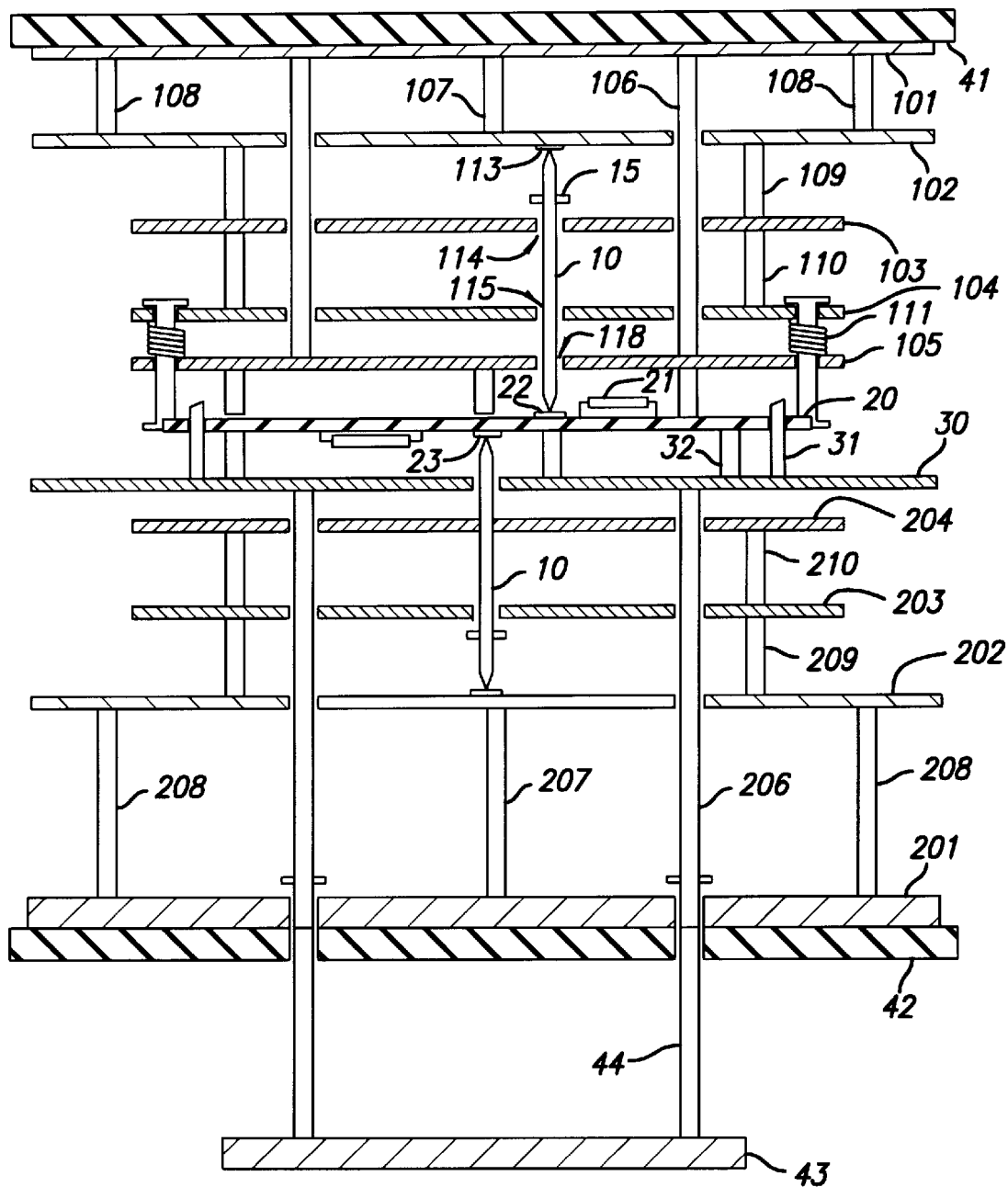
FIG. 3 is another cross-sectional view of the test unit of FIG. 2 during testing.

FIG. 2 shows an upper test unit 100 and a lower test unit 200 according to the present invention which are assembled onto a main body of a conventionally known test apparatus, and a printed circuit board 20 which is set on the main body of the test apparatus. FIG. 3 shows a test being performed where the upper test unit 100 is lowered and the lower test unit 200 is raised. In FIGS. 2 and 3, only one probe 10 each is shown above and below the printed circuit board 20. However, in reality, hundreds of probes 10 are employed in the units.

The test apparatus having the upper and lower test units 100, 200 varies according to the type of printed circuit board used as a printed circuit board 20 for testing. However, the main body of the test apparatus having a mechanism for positioning the test unit and the printed circuit board 20, a mechanism for fixing the test units, driving means for lowering and raising the test units, means for carrying, fixing and taking out the printed circuit board 20, etc. is commonly used for multiple types of printed circuit boards 20. In FIGS. 2 and 3, only the portions of the main body of the test apparatus which are necessary for explaining the present invention are shown.

A printed circuit board setting board 30 having the a printed circuit board 20 mounted thereon is carried to the main body of the test apparatus and is positioned in a predetermined location by the positioning mechanism and the fixing means (not shown). On the printed circuit board setting board 30, guide pins 31 for setting the printed circuit board 20 in a predetermined position and support columns 32 for supporting the printed circuit board 20 are provided.

The upper test unit 100 is provided with a base board 101, an interface board 102, a first probe retention board 103, a second probe retention board 104, a printed circuit board pressing plate 105, the probes 10, etc. The base board 101, the interface board 102, and the first and second probe retention boards 103, 104 are fixed among each other by linking means of support columns 107, 108, 109, 110, etc. The printed circuit board pressing plate 105 is provided to be able to move upward and downward with respect to the second probe retention board 104 by linking materials 111 having elastic materials such as springs, etc. Further, the base board 101 is provided with a removable upper plate 41. Accordingly, when the upper plate 41 moves up and down, this causes the entire upper test unit 100 to move up and down, respectively.

The base board 101 is equipped with the support column 107 and a press pole 106. When load is exerted from the probe 10 onto the interface board 102, the interface board 102 does not get warped because the support column 107 supports the upper surface of the interface board 102. Further, the base board 101 and the interface board 102 are fixed by the support column 108.

The interface board 102 is made of a 1.6 mm thick printed circuit board and employs a pad 113, which is a conductive printed circuit pattern, where it contacts the probe 10. As shown in FIG. 4, electrical signals can be transmitted between a tester (not shown) and the probe 10 by connecting lead of a connector (not shown) of the pad in a printed circuit pattern on the interface board 102.

The first and second probe retention boards 103, 104 are 1.6 mm thick glass epoxy resin boards and correspond to a socket support plate 402 in FIG. 4. Further, where the probe 10 passes, pass-through apertures 114, 115 are provided. When using a probe having a 1.00 mm diameter, a predetermined amount of accuracy is obtained by having the diameters of the pass-through apertures 114, 115 to be 1.03 mm to 1.05 mm approximately. Further, depending on the required accuracy of the position of the end tip of the probe 10 on the side of the printed circuit board 20, the diameters of the through-pass apertures 114, 115 are suitably enlarged or made smaller.

The diameter of the flange 15 provided on the probe 10 is made larger than the diameters of the pass-through apertures 114, 115. Further, the distance between the interface board 102 and the first probe retention board 103 in the pre-testing stage shown in FIG. 2 is designed to be smaller than P1 shown in FIG. 1 (a). Accordingly, the movement of the flange 15 of the probe 10 is limited by the interface board 102, and the moveable needle 13 of the probe 10 sinks and a slight load is placed. As a result, the probe 10 and the interface board 102 are always in contact, i.e., poor contact does not occur. Further, because in such a case the load is slight, excessively large load is not placed on the first probe retention board 103 via the flange 15 of the probe 10. Accordingly, it is possible to make the first probe retention board 103 thin and lighten the upper test unit 100. Furthermore, although placing a load on the moveable needle 13 of the probe 10 and placing the moveable needle 13 on the side of the interface board 102 both increase the effectiveness of the present invention, but are not required.

When testing as shown in FIG. 3, load is placed on the probe 10, and the probe 10 will be in the state shown in FIG. 1 (b). Going through the states of FIG. 2 to FIG. 3, the probe 10 slides along the pass-through apertures 114, 115 of the first and second probe retention boards 103, 104. In this way, the first and second probe retention boards 103,104 themselves function as sockets. Therefore, the need to use a socket is obviated and number of parts are decreased; it is possible to increase the reliability of the device, and at the same time it is no longer necessary to perform the step of driving a socket 406 in a socket support plate 402.

Further, for the testing shown in FIG. 3, since the load from the probe 10 is placed only against the interface board 102, no load is placed on the first and second probe retention boards 103, 104. Hence, it is possible to make the first and second probe retention boards 103, 104 using thin material (s) thereby lightening the weight of the upper test unit 100.

The space between the first probe retention board 103 and the second probe retention board 104 is set to be 5 mm by the support column 110. As a result, even if the first and second probe retention boards 103, 104 are thin, it is possible to obtain accurate perpendicularity of the probe 10.

Further, the interface board 102 and the first and second probe retention boards 103, 104 are fixed, depending also on the location, but for example, by using the support columns 109, 110 which are female screws on both ends and screws, or by using support columns 109, 110 which are female screws on one side and male screws on the other side, screws, and nuts.

The above-stated printed circuit board pressing plate 105 is employed on the lowest portion of the upper test unit 100. On the printed circuit board pressing plate 105, a support column 112 is provided. As shown in FIG. 3, in order to prevent the printed circuit board 20 from warping upward by receiving force from the probe 10 on the lower surface, the support column 112 supports it from or pushes on the upper surface. The support column 112 can be fitted on the printed circuit board pressing plate 105 with screws, adhesives, etc. Further, by the press pole 106, which is installed on the base board 101, being lowered relative to the printed circuit board pressing plate 105, it can transmit the force to the printed circuit board pressing plate 105 from the upper plate 41 of main body of the test apparatus. In other words, the press pole 106, the printed circuit board pressing plate 105, and the support column 112 support or push the printed circuit board 20 from above.

The printed circuit board pressing plate 105 is supported to be vertically moveable by the second probe retention plate 104 via the linking material 111. There is a predetermined play in pass-through apertures 116, 117 through which the linking material 111, provided between the second probe retention plate 104 and the printed circuit board pressing plate 105, passes. To prevent the above-mentioned play from affecting the probe 10 when the printed circuit board pressing plate 105 is moved left and/or right, the diameter of a pass-through aperture 118 is fixed, which is set in the printed circuit board pressing plate 105 through which the probe 10 passes.

As stated above, the upper test unit 100 is designed to be a set which includes the support columns 108, 109, 110 and the linking material 111, it is possible to remove it from the main body of the test apparatus and easily store on a shelf, etc. Further, since due to the spring force of the linking material 111, the tip end of the probe 10 does not protrude forward of the support column 112 of the printed circuit board pressing plate 105, the tip end of the probe 10 can be protected. In the embodiment, the first and second probe retention plates 103, 104 are used, but they can be substituted by one thick probe retention plate. Further, it is possible to eliminate the second probe retention plate 104 and have the printed circuit board pressing plate 105 perform its function instead. In other words, the required accuracy in the position of the tip end of the probe 10, weight, price, etc. are comprehensively judged and adopted.

Next, the lower test unit 200 is explained. The lower test unit 200 is constructed of a base plate 201, an interface plate 202, a first probe retention plate 203, a second probe retention plate 204, another probe 10, etc. The lower test unit 200 has a construction which is similar to that of the upper test unit 100. However, because there is nothing which corresponds to the printed circuit board pressing plate 105 of the upper test unit 100, a mechanism for pressing the printed circuit board 20 to be tested is different.

Although in the upper test unit 100, shifting of the probe 10 and shifting of the printed circuit pressing plate 105 are carried out together, in the lower test unit 200 the probe 10 and the mechanism for pressing the printed circuit board 20 move independent of each other. Since the base plate 201 of the lower test unit 200 is installed on a lower plate 42 of the main body of the test apparatus, when the lower plate 42 is raised the lower test unit 200 is also raised. A press pole 206 is provided with a flange in its lower section and is designed so as not to become separated from the lower test unit 200. On a press pole drive plate 43, which is a part of the main body of the test apparatus, a press pole drive pole 44 is provided, and the upper end thereof is in contact with the lower end of the press pole 206. When the press pole drive plate 43 is raised, the press pole 206 is raised.

Then, operation of the upper test unit 100 and the lower test unit 200 during a test is explained. From the state shown in FIG. 2, the press pole drive plate 43 is raised, and it is raised up to where the top end of the press pole 206 comes in contact with a printed circuit board setting plate 30.

Next, the upper test unit 100 is lowered by L1 shown in FIG. 2, and the lower end of the support pole 112 installed on the printed circuit pressing board 105 comes in contact with the printed circuit board 20. If a wrong part instead of a part 21 of the printed circuit board 20 is mounted, and contacts the support pole 112, the printed circuit board pressing plate 105 does not descend to the predetermined position and the space between the printed circuit board pressing plate 105 and the second probe retention plate 104 is narrowed. Although not shown in FIG. 2, for example, if a limit switch is provided on the lower surface of the second probe retention plate 104, this would be detected and the descent of the upper test unit 100 is halted, thereby preventing damage to the printed circuit board 20.

Further, when lowered by a distance of L2 shown in FIG. 2, the tip end of the probe 10 comes in contact with a printed circuit pattern 22 of the printed circuit board 20. When descending further by a distance (L3–L2) shown in FIG. 2, the lower end of the press pole 106 comes in contact with the printed circuit board pressing plate 105, and does not move even if a force is applied on the lower surface of the printed circuit board pressing plate 105. Also, in this state, the probe 10 is shorter by (L3–L2) as compared with the beginning, and contacts the printed circuit board 20 with a predetermined load.

At this point, the upper test unit 100 will be as shown in FIG. 3. Here, while the coil spring 14 (please see FIG. 1(b)) in the probe 10 is being compressed, the probe 10 slides along the pass-through apertures 114, 115 of the first and second probe retention boards 103, 104. Further, since the printed circuit board 20 is supported on the lower surface by the support pole 206 and the support pole 32 of the printed circuit board setting plate 30 so that it does not warp even if load is placed by the probe 10 from above.

Next, when the lower plate 42 of the main body of the test apparatus is raised, the entire lower test unit 200 except the press pole 206 is raised and the tip end of the probe 10 contacts the printed circuit pattern 23 on the lower surface of the printed circuit board 20. Further, the lower test unit 200 is raised and the probe 10 comes to a stop as shown in FIG. 3 when a predetermined amount of load is placed. Since the printed circuit board 20 is already supported on the upper surface by the support column 112 of the printed circuit board pressing plate 105, it does not become warped even if load is placed from the probe 10 on the lower surface.

The order of assembly for the upper test unit 100 is explained. First, the press pole 106 and the support column 107 are installed on the base plate 101. Second, the support column 112 is installed on the printed circuit board pressing plate 105. Third, the first probe retention board 103 and the second probe retention board 104 are linked via the support column 109. Fourth, the second probe retention board 104 and the printed circuit board pressing board 105 are linked by the linking materials 111. Fifth, the flange 15 of the probe 10 is designed to catch the upper surface of the first probe retention board 103; insert the probe 10 in the first and second probe retention boards 103, 104 and the printed circuit board pressing plate 105. Sixth, while pressing the interface board 102, fix the interface board 102 and the first probe retention board 103 with the support column 109 placed therebetween. Seventh, insert the press pole 106 in the interface board 102, etc. and fix the base plate 101 and the interface board 102 with the support column 108 placed therebetween.

Further, by removing screws, etc. for fixing the support columns 109, 110 between the interface board 102, the probe retention boards 103, 104, etc., the probe 10 can be exchanged easily. For the lower test unit 200, assembly can be accomplished performing similar steps as above.

As explained, the upper test unit 100 and the lower test unit 200 have parts whose construction enables easy assembly. For example, as for the upper test unit 100, as long as there are (a) a base plate 101 for installing on the main body of the test apparatus; (b) an interface board 102 having a desired printed circuit pattern laid thereon; (c) first and second probe retention boards 103, 104 provided with pass-through apertures 114, 115 through which a probe 10 and a press pole 106 pass; (d) a printed circuit board pressing plate 105, having screw hole for installation where the support column 112 is to be installed, or marked where the support column 112 is attached with adhesive; (e) the probe 10; (f) linking materials 111; (g) the press pole 106; and further (h) support columns 107, 108, 109,1 10; and (i) screws, etc., it can also be easily assembled without special skills. Of course, by similarly having the parts ready, the lower test unit 200 can easily be assembled.

In other words, if a test apparatus manufacturer makes the above-mentioned parts and ships them to a user, the user can assembled them. Accordingly, since in contrast with a conventional case where assembled test units are shipped, parts can be shipped, there are advantages: packing for protecting probes is not necessary and the package is smaller.

While specific embodiments of the present invention have been described above, it will be apparent that obvious variations and modifications for the present invention will occur to those of ordinary skill in the art from a consideration of the foregoing description. It is therefore desired that the present invention be limited only by the appended claims and equivalents. For example, thickness, spacing, etc. of the first and second probe retention boards 103, 104 can be varied for use. Further, means for preventing warping of the printed circular board 20 due to load received by a probe 10 can suitably be changed.

Additionally, although in the above described embodiment, it is designed so that the support column 112 supports the printed circuit board 20, instead of the support column 112 it can be supported by a board which is drilled by a rooter process to fit the form of the part 21 on the printed circular board 20. Although the embodiment was described using the base plate 101, but it is possible to omit the base board 101 by using a construction where the press pole 106 is mounted on the interface board 102. Further, the embodiment shows an example of testing where the probes contact the printed circuit board 20 from both sides, but the present invention can be adopted for testing by making the probe 10 contact from only one side of the printed circuit board 20. Furthermore, the present invention can be used not only for testing a printed circuit board with electronic parts mounted therein, but also for testing a printed circuit board before electronic parts are mounted thereon.

What is claimed is:

1. An apparatus for testing a printed circuit board comprising:

a probe having needle portions provided on both ends and a flange on the exterior circumference thereof, wherein at least one of the needle portions of the probe is movable;

an interface board being parallel to the printed circuit board and having patterns of conductivity; and probe retention means having a pass-through aperture larger than the diameter of the probe and shorter than the diameter of the flange so that the probe vertically passes therein, the probe retention means being disposed between the printed circuit board and the interface board, wherein the probe retention means is parallel to the interface board and fixed to the interface board such that the probe retention means and the interface board are spaced apart therebetween, wherein the flange is disposed between the interface board and the probe retention means to define the probe's travel such that the probe does not fall out from the probe retention means and wherein the probe is slidably retained in the pass-through aperture of the probe retention means when force is applied to the probe, wherein one of the needle portions of the probe comes in contact with the printed circuit board and the other needle portion of the probe comes in contact with the conductivity patterns of the interface board when the printed circuit board is tested.

2. An apparatus as claimed in claim 1, wherein the probe retention means has multiple probe retention boards.

3. An apparatus as claimed in claim 1, further comprising resilient means coupled with the probe retention means.

4. An apparatus as claimed in claim 3, wherein the resilient means includes a coil spring.

5. The apparatus as claimed in claim 1, further comprising a pressing plate having a pass-through aperture for the probe to slide therein, the pressing plate disposed between the printed circuit board to be tested and the probe retention means wherein the pressing plate is supported by the probe retention means and is movable upward and downward.

6. A tester for testing a defect in a printed circuit board comprising:

a first unit disposed on one side of the printed circuit board including:

a first probe including a first moveable needle portion and a first fixed needle portion and a first flange, the first fixed needle portion disposed substantially normal to the printed circuit board, a first interface board parallel to the printed circuit board and having patterns of conductivity; and a first probe retention board having a first pass-through aperture larger than the diameter of the first probe and shorter than the diameter of the first flange so that the first probe vertically passes therein, the first probe retention board disposed between the printed circuit board and the first interface board, wherein the first probe retention board is parallel to the first interface board and fixed to the first interface board such that the first probe retention board and the first interface board are spaced apart therebetween, wherein the first probe retention board defines the first pass through aperture for slidably retaining the first probe; and a second unit disposed on the opposite side of the printed circuit board relative to the first unit comprising:
a second probe including a second movable needle portion and a second fixed needle portion and a second flange, the second fixed needle portion disposed normal to the printed circuit board,
a second probe retention board defining a second aperture for slidably retaining the second probe and
a second interface board disposed parallel to the second probe retention board,
wherein the first and second probes come in contact with the printed circuit board, wherein the first flange is disposed between the first probe retention board and the first interface board to define the first probe's travel wherein the first probe does not fall out from the first probe retention board, and the second flange is disposed between the second probe retention board and the second interface board to define the second probe's travel wherein the second probe does not fall out from the second probe retention board, and wherein the first and second flanges abut the first and second probe retention boards, respectively.

7. A tester as claimed in claim 6, wherein the first unit travels downward to test the printed circuit board.

8. A tester as claimed in claim 6, wherein the second unit travels upward to test the printed circuit board.

9. The tester as claimed in claim 6, wherein the first and the second probe retention boards each further comprises multiple probe retention boards.

10. The tester as claimed in claim 6, wherein one of the needle portions of the first and the second probes each come in contact with the first and second interface boards, respectively, with a certain force even when the printed circuit board is not under test.

11. The tester as claimed in claim 6 wherein the first and the second interface boards are connected with the tester.

12. A tester as claimed in claim 6, further comprising a pressing plate having a pass-through aperture for one of the first probe and second probe to slide therein, the pressing plate disposed between the printed circuit board to be tested and one of the first and second probe retention boards wherein the pressing plate is supported by one of the first and second probe retention boards and is movable upward and downward.

13. A tester as claimed in claim 6, further comprising a third probe retention board adjacent the first probe retention board, the third probe retention board defining a third aperture for slidably retaining the first probe.

14. A tester as claimed in claim 6, wherein the first interface board is another printed circuit board.

15. A tester as claimed in claim 6, further comprising resilient means coupled to one of the first and second probe retention boards.

16. The apparatus as claimed in claim 1, wherein one of the needle portions of the probe comes in contact with the interface board with a certain force even when the printed circuit board is not under test.

17. The apparatus as claimed in claim 1, wherein the interface board is connected with the apparatus for testing the printed circuit board.

* * * * *